(12) United States Patent
Rowell et al.

(10) Patent No.: US 11,397,205 B2
(45) Date of Patent: Jul. 26, 2022

(54) MEASUREMENT SYSTEM AND METHOD OF PERFORMING AN OVER-THE-AIR TEST

(71) Applicant: Rohde & Schwarz GmbH & Co. KG, Munich (DE)

(72) Inventors: Corbett Rowell, Munich (DE); Daniel Markert, Munich (DE); Benoit Derat, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/072,582

(22) Filed: Oct. 16, 2020

(65) Prior Publication Data
US 2021/0148959 A1    May 20, 2021

(30) Foreign Application Priority Data
Nov. 14, 2019   (EP) .................................. 19209229

(51) Int. Cl.
| | | |
|---|---|---|
| *G01R 31/302* | (2006.01) | |
| *G01R 29/08* | (2006.01) | |
| *G01R 29/10* | (2006.01) | |

(52) U.S. Cl.
CPC ..... *G01R 29/0871* (2013.01); *G01R 29/0878* (2013.01); *G01R 29/105* (2013.01)

(58) Field of Classification Search
CPC .. G01R 29/10; G01R 29/105; G01R 29/0871; G01R 31/2822; G01R 31/2856;
(Continued)

(56) References Cited

U.S. PATENT DOCUMENTS

| | | | | |
|---|---|---|---|---|
| 2005/0059355 A1* | 3/2005 | Liu | ................... | H04B 17/3912 455/67.14 |
| 2010/0039332 A1 | 2/2010 | Dybdal et al. | | |

(Continued)

FOREIGN PATENT DOCUMENTS

| | | |
|---|---|---|
| EP | 3276362 A1 | 1/2018 |
| EP | 3546958 A1 | 10/2019 |
| WO | 2012/089892 A1 | 7/2012 |

OTHER PUBLICATIONS

Keysight Technologies, "TP to 38.810: Rationale behind IFFI (CATR)," 3GPP TSG-RAN4 Meeting RAN4#86, Athens, Greece, Mar. 2018, 17 pages.

(Continued)

*Primary Examiner* — Thang X Le
(74) *Attorney, Agent, or Firm* — Christensen O'Connor Johnson Kindness PLLC (57) ABSTRACT

A measurement system for testing a device under test includes a signal generation and/or analysis equipment, several antennas, several reflectors and a test location for the device under test. The antennas are connected with the signal generation and/or analysis equipment in a signal-transmitting manner Each of the antennas is configured to transmit and/or receive an electromagnetic signal so that a beam path is provided between the respective antenna and the test location. The electromagnetic signal is reflected by the respective reflector so that the electromagnetic signal corresponds to a planar wave. Each antenna and the corresponding reflector together are configured to provide a corresponding quiet zone at the test location. At least one of the quiet zones provided is larger than the at least one other quiet zone and/or at least one of the antennas is configured to operate at a different frequency compared to the at least (Continued)

one other antenna. Further, a method of performing an over-the-air test of a device under test is described.

17 Claims, 3 Drawing Sheets

(58) Field of Classification Search
CPC ............ G01R 31/2884; G01R 31/2889; G01R 31/2834; G01R 31/3025; G01R 31/31905; G01R 1/045; G01R 1/048; G01R 1/18; G01R 1/24
See application file for complete search history.

(56) References Cited

U.S. PATENT DOCUMENTS

| | | | |
|---|---|---|---|
| 2011/0084887 A1* | 4/2011 | Mow | G01R 29/10 343/703 |
| 2013/0210474 A1 | 8/2013 | Kyösti | |
| 2019/0101579 A1 | 4/2019 | Rowell et al. | |
| 2019/0199002 A1* | 6/2019 | Rowell | H01Q 19/022 |
| 2019/0207686 A1* | 7/2019 | Rowell | H01Q 15/14 |
| 2019/0302184 A1* | 10/2019 | Rowell | H04B 17/101 |
| 2021/0265742 A1* | 8/2021 | Lee | G01R 29/10 |

OTHER PUBLICATIONS

Farabakhsh, A., et al., "Analysis and design of metallic parabolic anechoic chamber," 11th European Conference on Antennas and Propagation (EUCAP), Mar. 2017, 4 pages.

* cited by examiner

MEASUREMENT SYSTEM AND METHOD OF PERFORMING AN OVER-THE-AIR TEST

TECHNICAL FIELD

Embodiments of the present disclosure relate to a measurement system for testing a device under test over-the-air. Further, embodiments of the present disclosure relate to a method of performing an over-the-air test of a device under test.

BACKGROUND

In the state of the art, measurement systems are known for testing devices under test with regard to their over-the-air characteristics (OTA characteristics). The device under test typically relates to a communication device that uses modern telecommunication standards for communicating with another communication device, for instance a mobile device or a base station. For testing the device under test, at least one measurement antenna is directed towards the device under test to be tested by the measurement system wherein this measurement antenna is located in the far-field of the device under test. Hence, it is ensured that the far-field characteristics of the device under test can be tested in an appropriate manner.

Furthermore, it is known to use multiple measurement antennas that are located in the far-field in order to test the far-field characteristics of the device under test in a more accurate manner. For instance, handover scenarios can be tested by the multiple measurement antennas.

Typically, different measurement setups, for instance after rearranging reflectors provided by the measurement system, are used for testing the device under test according to different test scenarios. These different test scenarios may relate to radio resource management (RRM), multiple-input multiple-output (MIMO) and/or radio frequency (RF) measurements requiring different setups.

Accordingly, it is necessary to adapt the respective measurement system concerning its respective setup or rather use different measurement systems for performing the respective measurements.

Obviously, the adaption of the measurement setup, by either adapting the measurement system or using a completely different measurement system, is time-consuming. Accordingly, there is a need for a more efficient possibility to perform different tests on a device under test.

SUMMARY

The present disclosure provides examples of a measurement setup for testing a device under test over-the-air (OTA). In an embodiment, the setup comprises a signal generation and/or analysis equipment, several antennas, several reflectors and a test location for the device under test. The antennas are connected with the signal generation and/or analysis equipment in a signal-transmitting manner Each of the antennas is configured to transmit and/or receive an electromagnetic signal so that a beam path is provided between the respective antenna and the test location. The electromagnetic signal is reflected by the respective reflector so that the electromagnetic signal corresponds to a plane wave. Each antenna and the corresponding reflector together are configured to provide a corresponding quiet zone at the test location. Further, at least one of the quiet zones provided is larger than the at least one other quiet zone. Alternatively or additionally, at least one of the antennas is configured to operate at a different frequency compared to the at least one other antenna.

Further, the present disclosure provides examples of a method of performing an over-the-air test of a device under test. In an embodiment, the method comprises the following steps:

providing a measurement system for testing the device under test over-the-air, wherein the measurement system comprises several antennas as well as several reflectors orientated towards a test location for the device under test, wherein each antenna is assigned to one respective reflector such that a beam path is provided between the respective antenna and the test location, and wherein each antenna and the corresponding reflector together provide a corresponding quiet zone at the test location, positioning the device under test at the test location, and using at least one of the reflectors and the corresponding antenna for radio frequency measurements, whereas at least one of the other reflectors and the corresponding antenna are used for radio resource management or multiple-input multiple-output measurements, and/or operating at least one of the antennas at a different frequency compared to at least one other antenna.

The present disclosure is based on the finding that a single measurement system can be used for performing different measurements simultaneously, namely RRM, MIMO and RF measurements, with the same test setup of the respective measurement system, as the measurement system has differently sized quiet zones at the same time and/or the respective electromagnetic signals have different frequencies. Therefore, it is not necessary to adapt the measurement system or rather its setup in order to perform those different measurements mentioned above. In other words, separate measurement systems or rather separate test setups of the same measurement system are no more necessary. Moreover, it is no more necessary to re-arrange the respective reflectors in order to obtain different test setups allowing to perform those different measurements by the same measurement system.

Thus, the overall measurement time required for performing the different measurements associated with the different test scenarios is reduced significantly, which yields lower testing costs.

The respective antennas and the corresponding reflectors together each ensure that indirect far-field (IFN) conditions are provided at the test location. The indirect far-field (IFF) conditions obtained ensure that a respective quiet zone is provided encompassing the test location (and the device under test located at the test location during testing). Generally, the measurement system comprises differently (physically) shaped reflectors, namely at least one large reflector, also called radio frequency (RF) reflector, as well as at least one smaller reflector, also called radio resource management (RRM) or rather multiple-input multiple-output (MIMO) reflector. In some embodiments, the at least one RF reflector is used for performing the respective RF measurements, whereas the at least one RRM/MIMO reflector is used for performing the respective RRM/MIMO measurements.

The measurement system may comprise multiple reflectors, for instance three, four or five reflectors. Thus, a first subset of reflectors, which may comprise at least one reflector, may be physically large compared to a second subset of reflectors, which may also comprise at least one reflector. For instance, the second subset comprises all reflectors except for one that is assigned to the first subset.

The measurement system may be configured to perform in-band (IB) and out-of-band (OOB) measurements simultaneously. The IB and OOB measurements generally relate to radio frequency (RF) measurements.

Moreover, the at least two reflectors may provide different-sized quiet zones at the test location. For instance, the first reflector is associated with a larger quiet zone than the second one, namely the one other reflector, in case of only two reflectors.

The at least one larger quiet zone provided by the respective antenna and the corresponding reflector may be larger than a typical direct far-field (DFF) quiet zone obtained by a measurement system.

Since the measurement system may comprise multiple reflectors, the first subset of reflectors may also be associated with a larger quiet zone compared to the second subset of reflectors.

Generally, the subsets of reflectors may have different characteristics of their respective reflectors.

Further, different frequency bands can be measured simultaneously by the measurement system provided that the antennas may be operated at different frequencies such that electromagnetic signals with different frequencies impinge on the corresponding reflectors. In other words, different frequency bands are measured simultaneously. In this specific case, the quiet zones may have the same size even though the reflectors have different physical sizes.

Generally, a quiet zone may relate to a volume in which the device under test is exposed to electromagnetic waves with nearly uniform amplitude and phase. Typically, minor deviations from the above-mentioned ideal situation are allowed in which the amplitude and phase are uniform within the volume.

For instance, the respective electromagnetic signal originating from the antenna is reflected by the corresponding reflector such that the electromagnetic signal relates to a planar wave at the test location.

In general, the measurement system corresponds to a compact antenna test range (CATR), as the measurement system ensures plane wave exposure of the device under test at its test location, namely within the respective quiet zone. In a real environment, a respective quiet zone is obtained by a long far-field range. However, the compact antenna test range ensures that the same characteristics, namely the quiet zone, is obtained at a short distance. As already mentioned, indirect far-field (IFF) conditions are provided due to the reflector(s) provided that reflect the electromagnetic signals from/towards the test location.

The respective reflectors may be shaped. For instance, the reflectors are shaped in a parabolic manner Hence, parabolically shaped reflectors are provided.

In general, the antennas of the measurement system correspond to feed antennas. Hence, the electromagnetic signals used for testing the device under test originate from the respective antennas.

According to an aspect, at least one of the reflectors is bigger than the at least one other reflector. Thus, the respective physical size of the reflectors is different. This may yield differently sized quiet zones. For instance, the quiet zone of the bigger sized reflector is between 20 cm and 40 cm, for instance (about) 30 cm, whereas the at least one other reflector has a quiet zone having a size between 10 cm and 30 cm, for example (about) 20 cm.

Another aspect provides that at least one of the reflectors has a different focal length compared to the at least one other reflector. The focal length generally allows to provide a bigger quiet zone while having the same distance between the test location and the respective reflector. Due to the different focal length of the at least one reflector, the corresponding antenna has a different distance to the respective reflector with the different focal length compared to the other pairs of reflectors and antennas. However, the different focal length can be used to ensure that the respective quiet zone is larger compared to the other ones.

In some embodiments, at least one of the antennas is moved with respect to its corresponding reflector in order to compensate for the different focal length of the reflector.

The physical size and/or the focal length relate(s) to a characteristic of the respective reflector.

Generally, the different reflectors and/or the corresponding antennas are placed at different angular offsets with respect to the test location.

For instance, the several reflectors and/or the several antennas are located along a circularly or elliptically shaped arc in the center of which the test location is located. The different reflectors may be distanced with respect to the test location by the same distance (radius) provided that the different reflectors are located on the circularly shaped arc.

The corresponding antennas may also be located on a circularly shaped arc such that the distance between each antenna and the corresponding reflector is the same.

One of the reflectors may be larger than the other ones resulting in a larger quiet zone.

The larger reflector can be used for radio frequency (RF) measurements, for instance in-band (IB) and out-of-band (00B) measurements, whereas the smaller reflector(s) is/are used for radio resource management (RRM) and/or multiple-input multiple-output (MIMO) measurements.

Generally, the respective measurements may be performed simultaneously or subsequently.

Besides the circularly shaped arc, the antennas and/or reflectors may also be located on an elliptically shaped arc.

If the focal length of one of the reflectors, for example the physical larger one, is different from the other ones, the reflectors may still be located on a shaped arc wherein the respective antenna assigned to the reflector having the different focal length is displaced with respect to the other antennas, which are located on a shaped arc. In other words, all antennas are no more located on the same arc, as the one assigned to the reflector with the different focal length is moved relatively to the reflector.

In some embodiments, the circularly or elliptically shaped arc maximally covers an angular area of 180°. This angular area is sufficient for testing the device under test with respect to handover scenarios. The circularly shaped arc covering an angular area of 180° corresponds to a semicircle.

As already mentioned above, the antennas and/or reflectors are placed at different angular offsets with respect to the test location. Hence, an angular area lower than 180° may be covered.

According to another aspect, at least the reflectors are each assigned to a corresponding adjustment unit configured to adjust the position and/or orientation of the respective reflector. Therefore, the reflectors may be adjusted with respect to their position and/or orientation, for example with respect to the test location or rather the corresponding antenna. In other words, the beam path provided between the antenna and the test location via the respective reflector can be adapted or rather adjusted by the adjustment unit while adjusting the position and/or orientation.

In some embodiments, the respective antenna and the corresponding reflector are mechanically coupled with each other by the adjustment unit. The adjustment unit may comprise an adjustment member on which the antenna and the corresponding reflector are located. In some embodiments, the antenna and the corresponding reflector are mechanically coupled with the adjustment member in a displaceable manner Therefore, the respective distance between the antenna and the corresponding reflector can be adjusted by the adjustment unit by simply displacing the antenna and/or the reflector with respect to each other, for example in a linear manner.

The adjustment unit may comprise a joint, wherein the reflector is mechanically coupled with the joint. Thus, the orientation of the reflector can be adjusted easily by the joint.

Furthermore, the antenna may also be coupled to the adjustment member by a displaceable joint. Hence, the orientation of the antenna can be adjusted easily as well.

Moreover, the adjustment units may be configured to position the several reflectors along a sphere or an ellipsoid enclosing the test location. In a simple test setup, the respective reflectors are located on a table or rather floor resulting in a horizontal arrangement.

However, the respective reflectors and/or the corresponding antennas may also be orientated in a different manner, for instance in a vertical manner (90° with respect to a horizontal plane) or any other angular inclination with respect to the horizontal plane. In some embodiments, an entire sphere or an entire ellipsoid can be covered by the different suitable positions of the reflectors and/or antennas.

The reflectors may be connected with each other by a support, for instance a rail or rather bar. In some embodiments, the support is shaped like a circular or elliptical arc. The respective support may be pivoted or rather set up from the horizontal plane, resulting in reflectors located at a certain angular inclination with respect to the horizontal plane.

In case of non-equally distributed reflectors, at least one balance weight is provided on the support, for example in case of an angled or rather vertical orientation of the respective reflectors due to their respective weight.

In a similar manner, the antennas may be connected with each other by a support, for instance a rail or rather bar. In some embodiments, the support is shaped like a circular or elliptical arc. The respective support may be pivoted or rather set up from the horizontal plane, resulting in antennas located at a certain angular inclination with respect to the horizontal plane.

According to another aspect, an elongation of the beam path portion located between the reflector and the test location is reflector-free. This means that no other reflector is provided within the elongation of the respective beam path portion originating from the reflector towards the test location. Accordingly, reflecting portions of the electromagnetic signal is prevented effectively, which would result in a standing wave, namely a resonance.

Another aspect provides that at least one absorbing baffle is provided. The at least one absorbing baffle may be located between neighbored reflectors. Alternatively or additionally, the at least one absorbing baffle is located between at least one reflector and the test location. Alternatively or additionally, the at least one absorbing baffle provides a partly opened housing for at least one antenna. Alternatively or additionally, the at least one absorbing baffle is located at a first end of a line at which opposite end the reflector is located. On the respective line, the test location is located, for example in its middle.

Generally, the absorber baffle reduces coupling and/or scattering effects between the respective components of the measurement setup, for example reflectors and their corresponding antennas. Furthermore, the absorbing baffle provides a shielding such that no external interfering signals may disturb the respective measurement.

In a similar manner, other measurement equipment located in the same room is not disturbed by the electromagnetic signals provided by the measurement system during the respective measurements.

In addition, the at least one absorbing baffle may establish an aperture around the antenna so that the respective antenna aims at the corresponding reflector, for example its center.

Furthermore, the elongation of the beam path portion located between the reflector and the test location may end at the at least one absorbing baffle, ensuring that no reflections take place that might impair the measurements, for instance providing a standing wave (resonance).

Another aspect provides that a device under test is provided that is located at the test location. The measurement system can be used to test the device under test appropriately. For this purpose, electromagnetic signals may be generated and transmitted towards the device under test.

According to another aspect, the measurement system comprises a positioner on which the test location is provided. The positioner may be a rotary positioner and/or a three-dimensional positioner. The respective positioner ensures that the behavior of the device under test can be measured separately for each angle by rotating the device under test through the field obtained under plane wave conditions within the quiet zone or rather at the test location. The positioner can include, for example, a rotary table or stage, or a three dimensional table with one or more linear or rotary stages.

Hence, a moving device under test can be used while performing the respective measurements so as to test performance characteristics of the device under test while moving. For instance, it can be verified how fast the device under test can switch between different base stations (handover scenario).

Moreover, center fed reflectors may be used. Accordingly, the respective antenna, the center of the corresponding reflector as well as the quiet zone are on a straight line.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
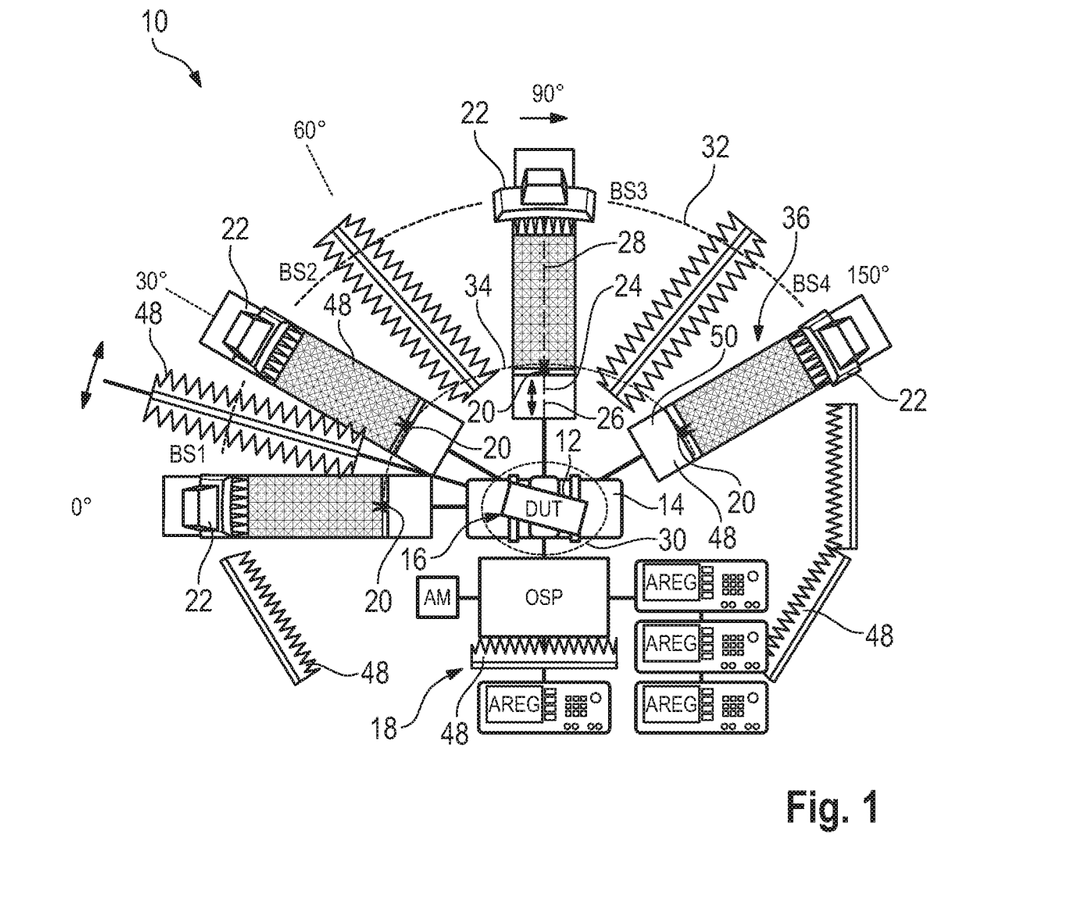
FIG. 1 shows a top view on a measurement system according to a first embodiment of the present disclosure.

In FIG. 1, a measurement setup or system 10 is shown that is used for testing a device under test 12 over-the-air, which is sometimes referred to as a DUT. As shown in FIG. 1, the embodiment shown, the measurement system 10 comprises a positioner 14 that defines a test location 16 for the device under test 12. The device under test 12 is mounted on the positioner 14, for example at the test location 16.

In the shown embodiment, the positioner 14 is established by a rotary positioner configured to rotate the device under test 12 in a plane around an axis of rotation. However, the positioner 14 may also be established as a three-dimensional positioner ensuring a three-dimensional movement of the device under test 12. The positioner can include, for example, a rotary table or stage, or a three dimensional table with one or more linear or rotary stages. Each stage can be active (computer controllable) or passive (user manipulated). If active, the stage can include one or more motors and associated equipment, circuitry, etc., configured for receiving a control signal and manipulating the position of the device under test 12 based on the received control signal.

The measurement system 10 also comprises signal generation and/or analysis equipment 18. In the embodiment shown, the signal generation and/or analysis equipment 18 is connected with the positioner 14 in order to control positioning of the device under test 12 by the positioner 14 during testing. In some embodiments, the signal generation and/or analysis equipment 18 issues respective control signals in order to control the position of the device under test 12.

The signal generation and/or analysis equipment 18 is also connected with several antennas 20 in a signal-transmitting manner Hence, measurement signals received by the antennas 20 are forwarded to the signal generation and/or analysis equipment 18. In a similar manner, signals to be emitted are forwarded to the antennas 20 by the signal generation and/or analysis equipment 18.

In the shown embodiment, the signal generation and/or analysis equipment 18 comprises a signal generation means, for instance so-called Automotive Radar Echo Generators ("AREG"), and a controlling platform, for instance an Open Switch and Control Platform ("OSP"). The OSP may be connected with an analyzing module ("AM").

As used herein, the term "module" refers to or includes a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon.

In some embodiments, each antenna 20 is assigned to its own signal generation means, namely its own AREG. Thus, each antenna 20 may receive a respectively generated electromagnetic signal to be emitted. Accordingly, the signals to be emitted are generated by the signal generation the signal generation and/or analysis equipment 18 and routed to the antennas 20 for being emitted towards the device under test 12.

The measurement system 10 further comprises several shaped reflectors 22, for example parabolic reflectors. Each of the reflectors 22 is assigned to one corresponding antenna 20 such that the respective antenna 20 and the corresponding reflector 22 together establish a pair.

Generally, a beam path 24 is provided between the respective antenna 20 and the test location 16 along which the electromagnetic signals propagate. One of the several beam paths 24 provided is schematically shown in FIG. 1 by respective dashed lines.

The beam path 24 comprises a first portion 26 located between the test location 16 and the reflector 22 as well as a second portion 28 established between the reflector 22 and the corresponding antenna 20. In some embodiments, the electromagnetic signal is reflected by the respective reflector 22 irrespective of the fact from where the electromagnetic signal originates, namely the device under test 12 or rather the respective antenna 20. In any case, it is ensured by the beam path 24 that the electromagnetic signal corresponds to a planar wave at the test location 16 or rather the respective antenna 20.

Generally, the antennas 20 may relate to feed antennas via which the electromagnetic signals are emitted. Accordingly, the electromagnetic signals emitted by the antennas 20 impinge on the reflectors 22 after having travelled along the second portion 28 of the beam path 24. The respective reflectors 22 reflect the incoming electromagnetic signals originating from the antennas 20 towards the test location 16 as well as the device under test 12 located at that test location 16. Hence, the electromagnetic signals reflected travel along the first portion 26 of the beam path 24.

In general, the measurement system 10 is configured to test the far-field characteristics of the device under test 12 even though the distance between the respective antennas 20 and the test location 16 is low. In order to ensure far-field characteristics at the test location 16, the respective electromagnetic signals are reflected by the reflectors 22 as mentioned above. Hence, so-called indirect far-field (IFF) conditions are provided. Accordingly, each antenna 20 and the corresponding reflector 22 together, namely the respective pairs, provide a dedicated quiet zone 30 at the test location 16 ensuring that the far-field characteristics of the device under test 12 can be measured accurately.

In FIG. 1, one quiet zone 30 is schematically illustrated by dashed lines. As shown in FIG. 1, the respective quiet zone 30 encompasses the device under test 12 and the test location 16, respectively.

In general, the measurement system 10 corresponds, for instance, to a so-called compact antenna test range (CATR) since the measurement system 10 ensures plane wave exposure of the device under test 12 at the test location 16 or rather within the respective quiet zone(s) 30.

In the embodiment shown in FIG. 1, the several reflectors 22 as well as the several antennas 20 each are located along a respective circularly shaped arc 32, 34 in the center of which the test location 16 or rather the device under test 12 is located. However, the respective arcs 32, 34 have different radii since the antennas 20 are located closer to the test location 16 or rather the device under test 12 than the reflectors 22.

The respective arcs 32, 34 each cover an angular area of 150°. However, an angular area up to 180° may be covered in general, which is sufficient for testing handover scenarios of the device under test 12, for instance.

Figure 4:
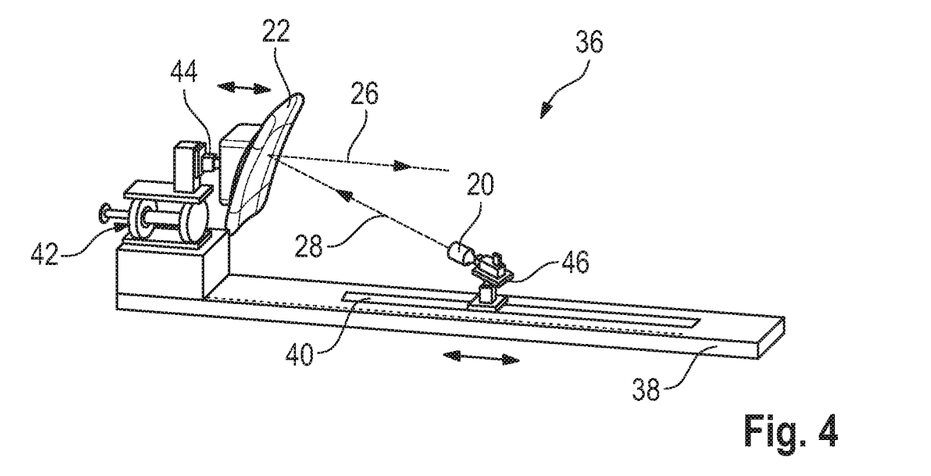
FIG. 4 schematically shows an adjustment unit of the measurement system according to a certain embodiment.

In some embodiments, each reflector 22 and the corresponding antenna 20 are mechanically coupled with each other by an adjustment unit 36, an example of which is shown in more detail in FIG. 4.

In the embodiment of FIG. 4, the adjustment unit 36 comprises an adjustment member 38 on which the antenna 20 and the reflector 22 are located in a displaceable manner such that the distance between the antenna 20 and the corresponding reflector 22 can be adjusted if necessary. In some embodiments, the antenna 20 is placed within a slot 40 provided within the adjustment member 38 such that the antenna 20 can be moved along the adjustment member 38 along the length of the slot 40. Hence, the antenna 20 can be moved in a linear manner towards the reflector 22 or away from the reflector 22 as indicated by the arrows. In some embodiments, the adjustment member can be or include an active (computer controllable) linear stage. If active, the stage can include one or more motors and associated equipment, circuitry, etc., configured for receiving a control signal and for manipulating the position of the antenna 20 with respect to the reflector 22 based on the received control signal.

Still referring to the embodiment of FIG. 4, the reflector 22 is assigned to a linear adjustment member 42 via which the distance of the reflector 22 can be fine-tuned with respect to the antenna 20, for example via a screw mechanism. In some embodiments, the reflector 22 may also be moved in a linear manner towards the antenna 20 or away from the antenna 20 as indicated by the arrows. Such linear movement can be carried out by any known arrangement. In an embodiment, such linear movement can be carried out by either a passive (user manipulated) or an active (computer controllable) linear stage. Again, if active, the stage can include one or more motors and associated equipment, circuitry, etc., configured for receiving a control signal and for manipulating the position of the reflector 22 with respect to the antenna 20 based on the received control signal.

In some embodiments, the adjustment unit 36 has a joint 44 with which the reflector 22 is mechanically coupled such that the orientation of the reflector 22 can be adjusted easily. Moreover, the antenna 20 is also mechanically coupled to the adjustment member 38 by a displaceable joint 46, for example.

Hence, each adjustment unit 36 is generally configured to adjust the relative orientation and/or position of the respective antenna 20 with respect to the corresponding reflector 22. However, the relative orientation and/or position of the antenna 20 and/or reflector 22 with respect to the test location 16 can also be adjusted by the respective adjustment unit 36.

In some embodiments, the adjustment units 36 are also configured to position the several reflectors 22 along a sphere or an ellipsoid enclosing the test location 16. In the shown top views, the respective reflectors 22 are located on a table or rather a floor resulting in a horizontal arrangement of the entire measurement system 10. However, the respective reflectors 22 and/or antennas 20 may also be inclined with respect to the horizontal plane, for instance in a vertical manner (90° with respect to the horizontal plane) or any other angular inclination with respect to the horizontal plane.

The respective arc 32 may be established by a support, for instance a rail or rather a bar, via which the reflectors 22 are connected with each other. For inclining the reflectors 22, the respective support is pivoted or rather set up from the horizontal plane, yielding the reflectors 22 to be located at a certain angular inclination with respect to the horizontal plane. In a similar manner, the respective arc 34 associated with the antennas 20 may be established by a support, for instance a rail or rather a bar. Accordingly, an entire sphere or an entire ellipsoid can be covered by the different suitable positions of the reflectors 22 and/or antennas 20.

In case of non-equally distributed reflectors 22, at least one balance weight is provided on the respective support, for example in case of an angled or rather vertical orientation of the respective reflectors 22 due to the weight of the reflectors 22.

Furthermore, FIG. 1 reveals that the measurement system 10 may comprise, in some embodiments, several absorbing baffles 48 that are located at different positions in order to provide a shielding and/or reduce coupling or rather scattering effects. As shown in FIG. 1, absorbing baffles 48 are located between neighbored reflectors 22, namely between each pair of neighbored reflectors 22, in order to reduce any coupling and/or scattering effects.

The absorbing baffles 48 are located opposite of each reflector 22 with respect to the test location 16, ensuring that electromagnetic signals propagating from the respective reflector 22 towards the test location 16 are absorbed by the reflector 22 after the electromagnetic signals have passed the test location 16. Put differently, the respective absorbing baffles 48 are located at a first end of a line at which opposite end the respective reflector 22 is located, wherein the test location 16 is positioned on that line.

In addition, absorbing baffles 48 are located on the bottom between each antenna 20 and the corresponding reflector 22, for example on the adjustment unit 36, such that scattering and/or coupling effects are reduced.

Moreover, absorbing baffles 48 also form partly opened housings 50 in some embodiments for the respective antennas 20 that are located within the housing 50 made of absorbing baffle material. Hence, the respective antennas 20 may focus on the corresponding reflectors 22. Put differently, the absorbing baffles 48 establish an aperture for the antennas 20.

Figure 2:
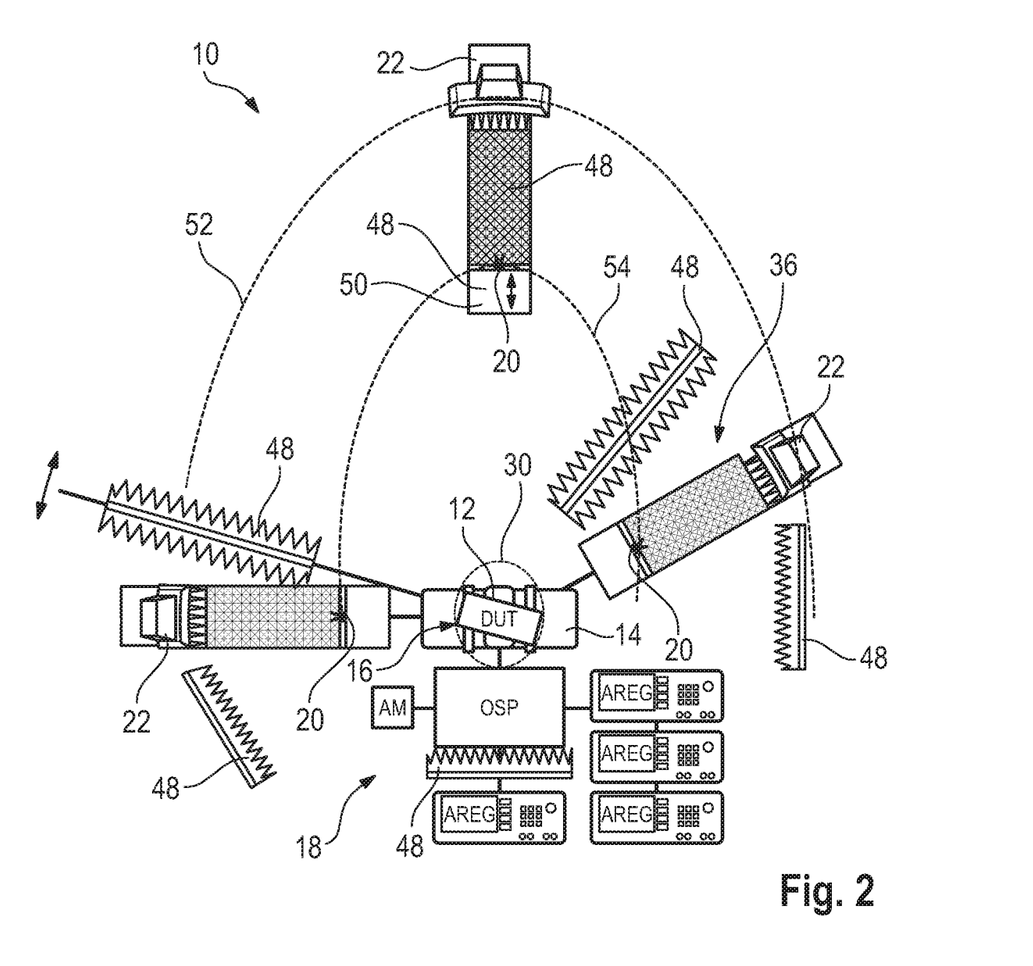
FIG. 2 shows a top view on a measurement system according to a second embodiment of the present disclosure.

In FIG. 2, another embodiment of the measurement system 10 is shown that differs from the one shown in FIG. 1 in that the antennas 20 as well as the reflectors 22 are located on elliptically shaped arcs 52, 54, respectively. Further, less antennas 20, namely three instead of four, less reflectors 22, namely three instead of four, as well as less absorbing baffles 48 are provided in the embodiment shown in FIG. 2 compared to the one shown in FIG. 1.

In general, the measurement system 10 can be used for performing different measurements either simultaneously or subsequently.

Figure 3:
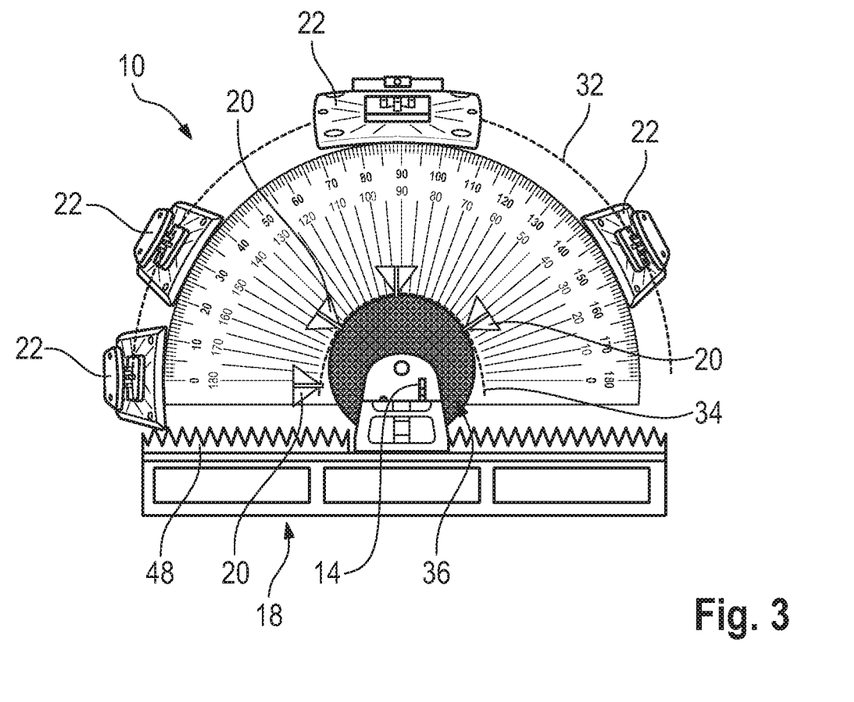
FIG. 3 shows a top view on a measurement system according to a third embodiment of the present disclosure.

The embodiments shown in FIGS. 1 to 3 comprise one reflector 22 that has a larger quiet zone 30, for instance of 30 cm, compared to the other reflectors 22, which each may have a quiet zone 30 of only 20 cm. For instance, the focal length of the reflector 22 with the larger quiet zone 30 is also different from the other reflectors 22. Hence, the reflectors 22 have different characteristics.

Then, the corresponding antenna 20 assigned to the reflector 22 with the different focal length is moved due to the different focal length of the respective reflector 22. Thus, the respective antenna 20 assigned to the reflector 22 with the different focal length is displaced with respect to the other antennas 20 that are located on the circularly or elliptically shaped arc 34, 54. In other words, the several antennas 20 are no longer located on the same arc 34, 54, as the antenna 20 associated with the reflector 22 with the different focal length is moved away from the respective arc 34, 54. However, the distance between the reflector 22 and the test location 16 is maintained. Hence, all reflectors 22 have the same distance to the test location 16. In other words, the reflectors 22 are still located on the circularly or elliptically shaped arc 32, 52.

The potential linear movement of the respective antenna 20 is indicated in FIGS. 1 and 2 by the respective arrows. In some embodiments, the antenna 20 is moved along the adjustment unit 36 as discussed above.

In some embodiments, the focal length may be the same for all reflectors 22. However, different sizes of the quiet zones 30 are obtained due to the different physical sizes of the reflectors 22. In some embodiments, one reflector 22 is bigger than the other reflectors 22, resulting in the larger quiet zone 30 for that specific reflector 22. Generally, the respective reflector 22 having the larger quiet zone 30 may be orientated vertically above or horizontally next to the device under test 12. In contrast thereto, the reflectors 22 with the smaller quiet zone 30 are placed at different angular offsets from the large reflector 22.

Moreover, the reflector 22 having the larger quiet zone 30 can be used for radio frequency (RF) measurements, for instance in-band (IB) and out-of-band (OOB) measurements, whereas the reflectors 22 with the smaller quiet zone 30 are used for radio resource management (RRM) and/or multiple-input multiple-output (MIMO) measurements.

In another embodiment, all reflectors 22 have the same focal length as well as the same size of the respective quiet zones 30 provided at the test location 16. However, the reflectors 22 may have different physical sizes.

In some embodiments, the corresponding antennas 20 of the reflectors 22 are operated at different frequencies.

This allows a wideband measurement, namely measuring several different frequency bands simultaneously, in the time of a single band measurement, as different frequency bands can be measured simultaneously.

In general, the different measurements mentioned above may be performed simultaneously or subsequently.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for testing a device under test over-the-air, comprising:
   a signal generation and/or analysis equipment, several antennas, several reflectors and a test location for the device under test,
   wherein the antennas are connected with the signal generation and/or analysis equipment in a signal-transmitting manner such that signals can be exchanged between the antennas and the signal generation and/or analysis equipment;
   wherein each of the antennas is configured to transmit and/or receive an electromagnetic signal so that a beam path is provided between the respective antenna and the test location;
   wherein the electromagnetic signal is reflected by the respective reflector so that the electromagnetic signal corresponds to a planar wave;
   wherein each antenna and the corresponding reflector together are configured to provide a corresponding quiet zone at the test location; and
   wherein at least one of the antennas is configured to operate at a different frequency compared to the at least one other antenna such that different frequency bands can be measured simultaneously by the measurement system as electromagnetic signals with different frequencies impinge on the corresponding reflectors.

2. The measurement system according to claim 1, wherein at least one of the reflectors is bigger than the at least one other reflector.

3. The measurement system according to claim 1, wherein at least one of the reflectors has a different focal length compared to the at least one other reflector.

4. The measurement system according to claim 1, wherein the several reflectors and/or the several antennas are located along a circularly or elliptically shaped arc in the center of which the test location is located.

5. The measurement system according to claim 4, wherein the circularly or elliptically shaped arc maximally covers an angular area of 180°.

6. The measurement system according to claim 1, wherein at least the reflectors are each assigned to a corresponding adjustment unit configured to adjust the position and/or orientation of the respective reflector.

7. The measurement system according to claim 6, wherein the respective antenna and the corresponding reflector are mechanically coupled with each other by the adjustment unit.

8. The measurement system according to claim 6, wherein the adjustment units are configured to position the several reflectors along a sphere or an ellipsoid enclosing the test location.

9. The measurement system according to claim 1, wherein an elongation of the beam path portion located between the reflector and the test location is reflector-free.

10. The measurement system according to claim 1, wherein at least one absorbing baffle is provided, wherein the at least one absorbing baffle is located between neighbored reflectors and/or wherein the at least one absorbing baffle is located between at least one reflector and the test location and/or wherein the at least one absorbing baffle provides a partly opened housing for at least one antenna and/or wherein the at least one absorbing baffle is located at a first end of a line at which opposite end the reflector is located.

11. The measurement system according to claim 1, wherein the device under test is provided that is located at the test location and/or wherein the measurement system comprises a positioner on which the test location is provided.

12. The measurement system according to claim 11, wherein the positioner is a rotary positioner and/or a three-dimensional positioner.

13. The measurement system according to claim 1, wherein center fed reflectors are used.

14. A method of performing an over-the-air test of a device under test, comprising:
providing a measurement system for testing the device under test over-the-air, wherein the measurement system comprises several antennas as well as several reflectors orientated towards a test location for the device under test, wherein each antenna is assigned to one respective reflector such that a beam path is provided between the respective antenna and the test location, and wherein each antenna and the corresponding reflector together provide a corresponding quiet zone at the test location;
positioning the device under test at the test location; and
using at least one of the reflectors and the corresponding antenna for radio frequency measurements, whereas at least one of the other reflectors and the corresponding antenna are used for radio resource management or multiple-input multiple-output measurements, and/or operating at least one of the antennas at a different frequency compared to at least one other antenna such that different frequency bands can be measured simultaneously by the measurement system as electromagnetic signals with different frequencies impinge on the corresponding reflectors.

15. The method according to claim 14, wherein at least one of the antennas is moved with respect to its corresponding reflector for compensating the different focal length of the reflector.

16. The method according to claim 14, wherein at least one of the reflectors is bigger than the at least one other reflector and/or wherein at least one of the reflectors has a different focal length compared to the at least one other reflector.

17. A measurement system for testing a device under test over-the-air, comprising:
a signal generation and/or analysis equipment, several antennas, several reflectors and a test location for the device under test,
wherein the antennas are connected with the signal generation and/or analysis equipment in a signal-transmitting manner such that signals can be exchanged between the antennas and the signal generation and/or analysis equipment;
wherein each of the antennas is configured to transmit and/or receive an electromagnetic signal so that a beam path is provided between the respective antenna and the test location;
wherein the electromagnetic signal is reflected by the respective reflector so that the electromagnetic signal corresponds to a planar wave;
wherein each antenna and the corresponding reflector together are configured to provide a corresponding quiet zone at the test location; and
wherein at least one of the reflectors is bigger than the at least one other reflector and/or wherein at least one of the reflectors has a different focal length compared to the at least one other reflector such that at least one of the quiet zones provided is larger than the at least one other quiet zone.

* * * * *